US008553473B2

(12) United States Patent
Kim et al.

(10) Patent No.: US 8,553,473 B2
(45) Date of Patent: Oct. 8, 2013

(54) CLOCK GENERATOR CIRCUITS WITH NON-VOLATILE MEMORY FOR STORING AND/OR FEEDBACK-CONTROLLING PHASE AND FREQUENCY

(75) Inventors: Jaeha Kim, Seoul (KR); Brent Haukness, Monte Sereno, CA (US)

(73) Assignee: Rambus Inc., Sunnyvale, CA (US)

( * ) Notice: Subject to any disclaimer, the term of this patent is extended or adjusted under 35 U.S.C. 154(b) by 426 days.

(21) Appl. No.: 12/674,598

(22) PCT Filed: Aug. 22, 2008

(86) PCT No.: PCT/US2008/074008
§ 371 (c)(1),
(2), (4) Date: Jun. 8, 2011

(87) PCT Pub. No.: WO2009/026513
PCT Pub. Date: Feb. 26, 2009

(65) Prior Publication Data
US 2011/0228616 A1    Sep. 22, 2011

Related U.S. Application Data

(60) Provisional application No. 60/966,180, filed on Aug. 23, 2007.

(51) Int. Cl.
*G11C 7/06*    (2006.01)

(52) U.S. Cl.
USPC ............................ 365/189.07; 365/233.11

(58) Field of Classification Search
USPC .............. 365/189.07, 233.1, 233, 11, 233.11
See application file for complete search history.

(56) References Cited

U.S. PATENT DOCUMENTS

| 4,200,841 | A |  | 4/1980 | Nagata et al. ................. 455/169 |
| 5,696,468 | A |  | 12/1997 | Nise |
| 5,910,741 | A |  | 6/1999 | Watanabe |
| 6,114,888 | A |  | 9/2000 | Walley .......................... 327/157 |
| 6,747,521 | B1 |  | 6/2004 | Allott ............................ 331/175 |
| 2005/0188230 | A1 | * | 8/2005 | Bilak ............................. 713/300 |
| 2007/0013449 | A1 |  | 1/2007 | Ishii et al. |

OTHER PUBLICATIONS

PCT Preliminary Examination Report dated Feb. 9, 2012 re Int'l. Application No. PCT/US08/74008. 4 Pages.
EP Response dated Nov. 9, 2012 re EP Application No. 08798485.2, includes New Claims 1-13 Main Request (clean and marked-up), New description p. 2, New Claims 1-13 Auxiliary Request I (clean and marked-up), New Claims 1-12 Auxiliary Request II (clean and marked up), New Claims 1-11 Auxiliary Request III (clean and marked up), and New Claims 1-13 Auxiliary Request IV (clean and marked up). 56 pages.

(Continued)

*Primary Examiner* — Huan Hoang
(74) *Attorney, Agent, or Firm* — Silicon Edge Law Group LLP; Arthur J. Behiel

(57) ABSTRACT

A clock-signal generator (e.g. a PLL or a DLL) uses non-volatile memory to store an analog control voltage that determines an output phase and/or frequency of the clock-signal generator. Locked loops take time to lock on a given reference frequency. To keep this time to a minimum, NVM 105 stores the control voltage during periods of inactivity, such as when the signal generator is powered down or in a standby mode. Non-volatile memory stores control voltages during operation in other embodiments to relax the area requirements otherwise required for integration capacitors to store phase and frequency information.

25 Claims, 5 Drawing Sheets

(56) References Cited

OTHER PUBLICATIONS

EP Office Communication dated May 4, 2011 re EP Application No. 08798485.2. 6 Pages.
EP Response dated Sep. 9, 2011 to the Office Communication dated May 4, 2011 for EP Application No. 08798485.2. 19 Pages.
PCT Written Opinion dated Sep. 27, 2011 to the Int'l. Application No. PCT/US08/74008. 11 Pages.
Lee, H.M., et al. "NeoFlash—True Logic Single Poly Flash Memory Technology." 2006 IEEE. 2 pages.
Srinivasan, Venkatesh, et al., "A Precision CMOS Amplifier Using Floating-Gate Transistors for Offset Cancellation." IEEE Journal of Solid-State Circuits, vol. 42, No. 2, Feb. 2007. pp. 280-291.
Fox, Adrian, "Ask the Applications Engineer—30. PLL synthesizers." Analog Dialogue 36-03 (2002). 4 pages.
Rolandi, P.L., et al. "SA 21.2: 1M-Cell 6b/Cell Analog Flash Memory for Digital Storage." ISSC98 / Session 21 ; Memory NV and Embedded / Paper SA21.2. Digest of Technical Papers. Feb. 7, 1998. 1 page article not numbered, and pp. 335 and 459.
Papalias, Tamara A., "Standard CMOS Nonvolatile Reprogrammable Switch for Low Phase Noise in LC Oscillators." A dissertation submitted to the dept. of Electrical Engineering and the Committee of Graduate Studies of Stanford University. Oct. 2002. Pages: cover sheet and pp. 42-68.
Kinoshita, Shigeo, et al. "A PWM Analog Memory Programming Circuit for Floating-Gate MOSFETs with 75-μ Programming Time and 11-bit Updating Resolution." IEEE Journal of Solid-State Circuits, vol. 36, No. 8. Aug. 2001. pp. 1286-1290.
Min-Hwa, Chi and Bergemont Albert, "A New Single-Poly Flash Memory Cell with Low-Voltage and Low-Power Operations for Embedded Applications." MS E140, Advanced Technology Group, National Semiconductor Corporation, Santa Clara, CA. 1997. pp. 126-127.
Daly, William and Poulton, John W., "Digital Systems Engineering." Published by the Press Syndicate of the University of Cambridge. First published in 1998. Pages: cover sheet, publication page and pp. 314-331.
Groeseneken et al., "Basics of Nonvolatile Semiconductor Memory Devices," "Nonvolatile Semiconductor Memory Technology: A Comprehensive Guide . . . " 1997, pp. 1-88, IEEE Press.

\* cited by examiner

CLOCK GENERATOR CIRCUITS WITH NON-VOLATILE MEMORY FOR STORING AND/OR FEEDBACK-CONTROLLING PHASE AND FREQUENCY

FIELD

The subject matter disclosed herein relates generally to the field of communications, and more particularly to high speed electronic signaling within and between integrated circuit devices.

BACKGROUND

Most complex integrated circuits (ICs) utilize a clock signal to synchronize different parts of the circuit. Clock distribution is increasingly difficult as ICs become more complex and exhibit ever increasing speed performance. Many ICs generate high-quality clock signals using a class of reference circuits that include phase-locked loops (PLLs) and delay-locked loops (DLLs), collectively "locked-loop circuits." The following discussion focuses on PLLs, but is equally applicable to DLLs.

A typical PLL generates a stable clock signal using a voltage-controlled oscillator (VCO), the frequency of which is controlled by application of a control voltage. One type of PLL, a charge-pump PLL, adjusts the VCO frequency by moving charge to and from an integration capacitor to vary a control voltage for the VCO. The stored charge and resultant control voltage provide the phase and frequency information that directs the operation of the PLL.

Where a PLL is manufactured using complementary metal-oxide semiconductor (CMOS) processes, the gate capacitance of an n-channel field-effect transistor (FET) can be used as the integration capacitor. As advances are made in CMOS processing technology, however, gate oxide dielectric thickness is becoming thinner. Significant current leakage can occur from the gate electrode, through the thin gate oxide, and to the inversion channel of the transistor. This leakage introduces noise into the control voltage for the VCO, and this noise adversely affects the phase and frequency stability of the VCO.

Current leakage across integration capacitors can be reduced by using capacitors with metal plates. Realizing a capacitor of a given capacitance using a metal plate structure can require many times more semiconductor die area than realizing the capacitor using the gate capacitance of a FET. Moreover, the capacitance of metal plate capacitor structures can vary considerably from die to die and can be difficult to control. Current leakage across integration capacitors can also be reduced by using transistors with thick gate oxides. A transistor with a thick gate oxide, however, provides less capacitance per unit of semiconductor die area as compared to a transistor with a thin gate oxide. There is therefore a need for small, efficient means of controlling the phase and frequency of locked-loop circuits.

BRIEF DESCRIPTION OF THE DRAWINGS

The subject matter disclosed is illustrated by way of example, and not by way of limitation, in the figures of the accompanying drawings and in which like reference numerals refer to similar elements and in which.

DETAILED DESCRIPTION

Figure 1:
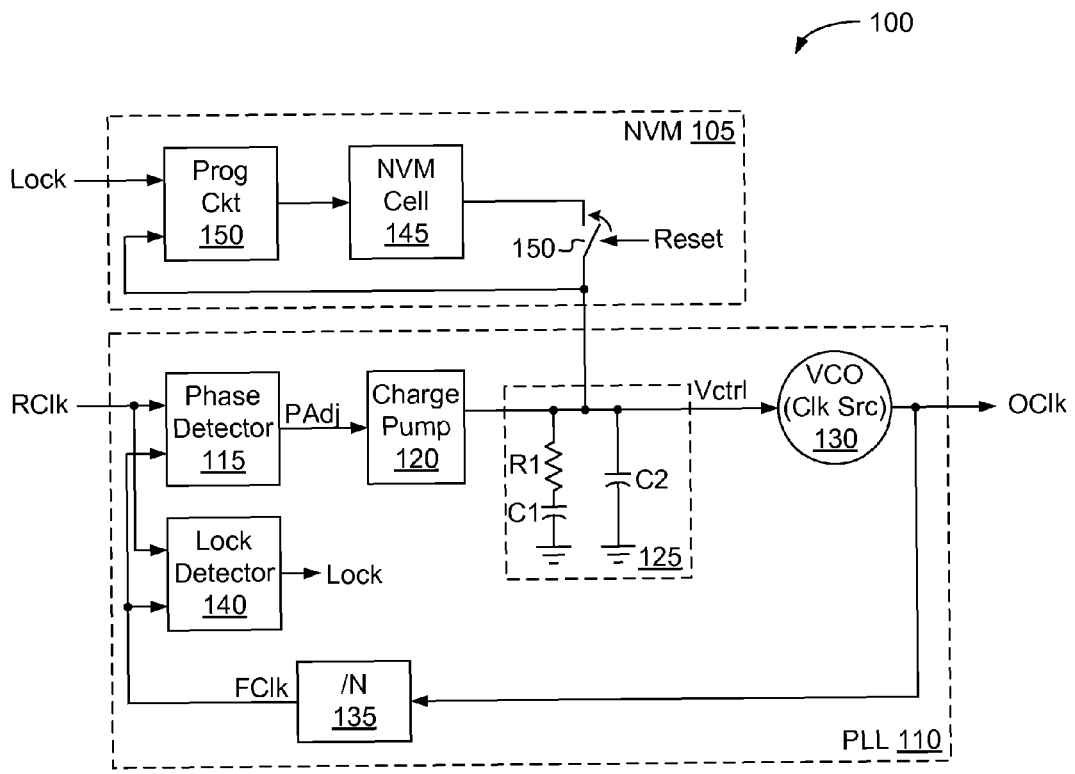
FIG. 1 depicts a clock-signal generator 100 that uses non-volatile memory (NVM) 105 to store an analog control voltage Vctrl that determines the output phase and frequency provided by an analog phase-locked loop (PLL) 110.

FIG. 1 depicts a clock-signal generator 100 that uses non-volatile memory (NVM) 105 to store an analog control voltage Vctrl that determines the output phase and frequency provided by an analog phase-locked loop (PLL) 110. PLL 110 takes time to lock the phase and frequency of its output clock signal OClk to a reference clock signal RClk. To keep this time to a minimum, NVM 105 stores the control voltage during periods of inactivity, such as where PLL 110 is powered down or in a standby mode to save power.

PLL 110 includes a phase detector 115, a charge pump 120, a low-pass filter 125, and a clock source 130 placed in a negative feedback configuration. A frequency divider 135 may be included in the feedback path between the output of clock source 130 and phase detector 115 to make the frequency of output clock signal OClk a multiple of the frequency of a reference clock signal RClk. A lock detector 140 compares reference clock RClk and a feedback clock FClk from divider 135 and issues a lock signal Lock when the two are matched in phase and frequency. The lock signal is distributed to memory 105 and elsewhere to indicate that output clock signal OClk is ready to act as a timing reference. Clock source 130 is a voltage-controlled oscillator (VCO) in this embodiment, but other clock sources may also be used.

During operation, phase detector 115 compares the phases of reference clock RClk and feedback clock FClk to develop phase-adjustment signals PAdj. Charge pump 120 responds to changes in phase-adjustment signals PAdj by adding charge to or removing charge from integration capacitors C1 and C2 of filter 125, and thereby changing control voltage Vctrl. The output frequency of clock source 130 is proportional to the difference between control voltage Vctrl and some voltage reference (e.g., ground potential serves as a voltage-reference node). Changes to control voltage Vctrl thus produce changes in the phase and frequency of clock signal OClk, and consequently in the phase and frequency of feedback clock FClk. Assuming reference clock signal RClk and feedback clock signal FClk are nearly matched in phase and frequency, if the phase of signal FClk falls behind that of reference clock RClk, phase detector 115 causes charge pump 120 to increase control voltage Vctrl to speed up clock source 130; conversely, if the phase of signal FClk moves ahead of reference clock RClk, phase detector 115 causes charge pump 120 to reduce control voltage Vctrl to slow down clock source 130.

Phase detector 115 may detect phase and frequency in embodiments in which the frequencies of signals RClk and FClk may differ considerably to prevent PLL 110 from locking on an incorrect frequency. Output clock signal OClk is generally distributed to one or more synchronous elements (not shown), though control voltage Vctrl is an output of interest in some systems. Various types of PLLs and their applications are well known to those of skill in the art. A detailed discussion of PLLs and their applications are therefore omitted for brevity.

Memory 105 includes a non-volatile memory cell 145, programming circuitry 150, and a switch 155. Programming circuitry 150 senses control voltage Vctrl and programs memory cell 145 to store control voltage Vctrl when lock signal Lock is asserted. NVM 105 then holds control voltage Vctrl when PLL 110 is inactive. Then, when PLL 110 is activated, a switch 150 closes responsive to a reset signal Reset so that memory cell 145 restores control voltage Vctrl to the voltage previously employed to lock PLL 110. The reset signal is then de-asserted and PLL 110 returns to normal operation. Setting the control voltage near the correct setting reduces the time required to return PLL to a locked state. Memory 105 can be programmed once, e.g. by an integrated circuit manufacturer, or can be programmed one or more times in system to accommodate variations in e.g. supply voltage, temperature, or the desired output frequency. Some embodiments may omit programming circuitry 150 in favor of an external programming means.

Figure 2:
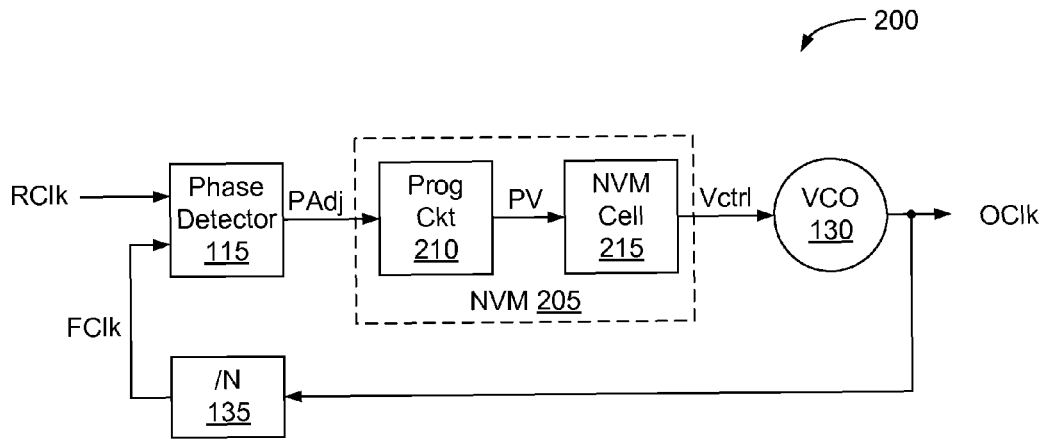
FIG. 2 depicts a clock-signal generator 200, a PLL, in accordance with another embodiment.

FIG. 2 depicts a clock-signal generator 200, a PLL, in accordance with another embodiment. Some components of clock-signal generator 200 may be common to generator 100 of FIG. 1, like-labeled elements being the same or similar. Generator 200 differs from the embodiment of FIG. 1, however, in that generator 200 employs non-volatile memory 205 in lieu of, or in conjunction with, an integration capacitor to supply clock source 130 with an appropriate control voltage Vctrl while the PLL is operational. This embodiment thus provides the advantages of generator 100 of FIG. 1 in that the control voltage can be stored when generator 200 is inactive. Also advantageous, generator 200 avoids or reduces charge leakage normally associated with integration capacitors, and can consequently be integrated within a considerably smaller area. This advantage may be particularly important for high-density, low bandwidth applications (e.g., cellular telephones) and for integrating external capacitors to reduce cost and the requisite number of device pads or pins.

Non-volatile memory 205 includes programming circuitry 210 and a non-volatile memory cell 215. As in the example of FIG. 1, phase detector 115 issues phase adjustment signals PAdj in response to phase differences between a reference clock signal RClk and a feedback clock signal FClk. Programming circuitry 210 develops programming voltages PV responsive to the phase-adjust signals and applies the programming voltages to memory cell 215. Programming voltages PV program NVM cell 215 to adjust control voltage Vctrl, and consequently the output phase and frequency of clock signal OClk from clock source 130. Clock-signal generator 200 thus maintains the phase relationship between feedback clock FClk and reference clock RClk, and consequently locks output clock signal OClk to reference clock signal RClk. The bandwidth of signal-generator 200 is limited by the speed at which non-volatile memory 205 may be programmed to alter control voltage Vctrl. This programming speed may be slow relative to the speed at which charge pump 120 of FIG. 1 can alter the control voltage on loop filter 125.

Figure 3:
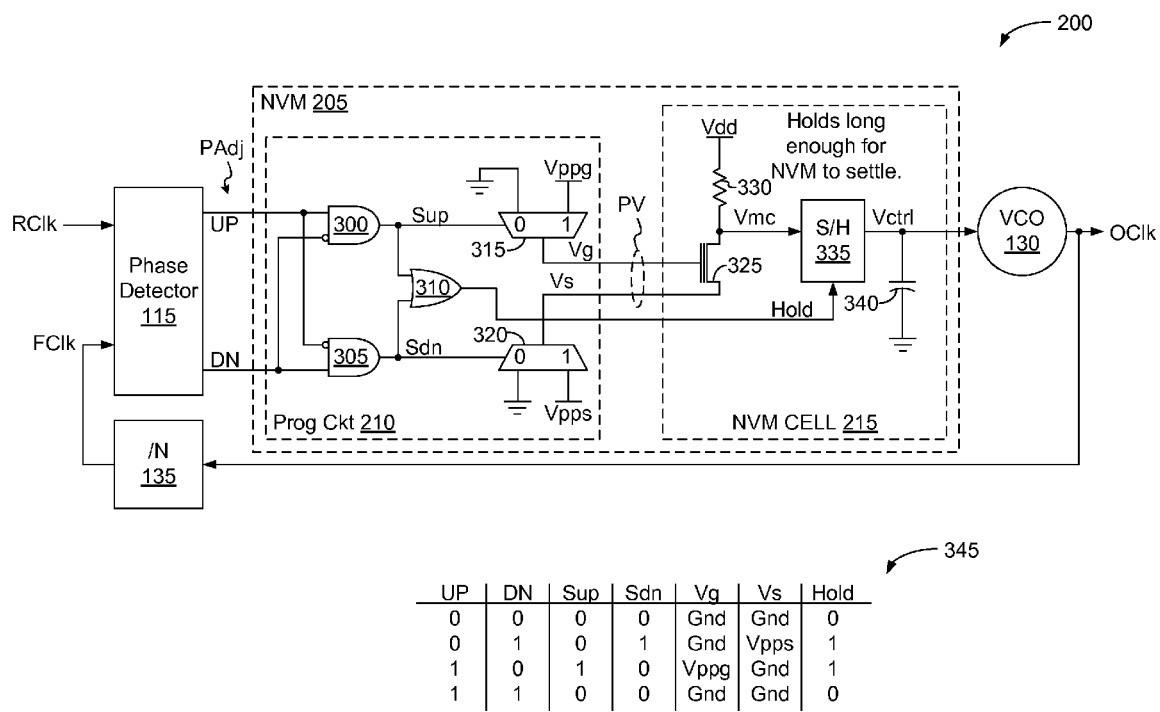
FIG. 3 highlights the workings of non-volatile memory 205 in one embodiment of clock-control circuitry 200 of FIG. 2.

FIG. 3 highlights the workings of non-volatile memory 205 in one embodiment of clock-control circuitry 200 of FIG. 2. Programming circuitry 210 includes a pair of AND gates 300 and 305, an OR gate 310, and a pair of analog multiplexers 315 and 320. Memory cell 215 includes a floating-gate transistor 325, a resistor 330, a sample-and-hold (S/H) circuit 335, and a capacitor 340. FIG. 3 includes a table 345 summarizing the logical behavior of programming circuit 210.

Programming voltages PV to memory cell 215 include a gate voltage Vg and a source voltage Vs that programming circuit 210 can control to increase (decrease) the threshold voltage Vt of transistor 325. An increased (decreased) threshold voltage in turn increases (decreases) the resistance through transistor 325 for a given gate/source voltage Vgs. Transistor 325 and resistor 330 form a voltage divider that produces a memory-cell voltage Vmc that varies with changes in the resistance through transistor 325. Programming circuit 210 can therefore alter voltage Vmc by programming the threshold voltage Vt of transistor 325. S/H circuit 335 stores memory cell voltage Vmc on capacitor 340 as control voltage Vctrl, and holds voltage Vctrl while transistor 325 undergoes programming. Transistor 325 stores phase and frequency information so capacitor 340 can be much smaller than would otherwise be required for an integration capacitor.

Phase detector 115 is, in this example, of a type in which the phase-adjust signals PAdj include an up signal UP and a down signal DN. Absent an up or a down signal, AND gates 300 and 305 each de-assert select-down and select-up signals Sdn and Sup to respective multiplexers 315 and 320. As a consequence, zero volts (ground) are applied to the gate and source of transistor 325. Memory cell voltage Vmc depends upon the resistance through transistor 325, and thus the threshold voltage Vt of transistor 325. OR gate 310 does not assert hold signal Hold, so S/H circuit 335 conveys memory cell voltage Vmc to capacitor 340 and clock source 130 as control voltage Vctrl.

Phase detector 115 asserts signal UP (DN) to increase (decrease) control voltage Vctrl and, consequently, the oscillation frequency of clock source 130. When signal UP is asserted, AND gate 300 asserts select-up signal Sup to multiplexer 315, AND gate 305 de-asserts select-down signal Sdn to multiplexer 320, and OR gate 310 asserts hold signal Hold. Multiplexers 315 and 320 respectively apply a gate programming voltage Vppg (e.g. 10 to 13 volts) to the gate of transistor 325 and a lower voltage (e.g. ground potential) to the source of transistor 325. The resulting voltage drop across the gate/source junction of transistor 325 draws negative charge to the floating gate of transistor 325, which increases the threshold voltage of transistor 325. When phase detector 115 de-asserts up signal UP, the increased threshold voltage increases the resistance through transistor 325, and consequently increases voltage Vmc. S/H circuit 335 conveys the increased memory cell voltage Vmc to oscillator 130 as the new control voltage Vctrl when hold signal Hold is de-asserted and after sufficient time has passed to allow Vmc to settle to its new value.

When signal DN is asserted, AND gate 305 asserts select-up signal Sdn to multiplexer 320, AND gate 300 de-asserts select-down signal Sup to multiplexer 315, and OR gate 310 asserts hold signal Hold. Multiplexers 315 and 320 respectively apply a ground potential to the gate of transistor 325 and a source programming voltage Vps (e.g. 10-13 volts) to the source of transistor 325. The resulting voltage drop across the gate/source junction of transistor 325 extracts negative charge from the floating gate of transistor 325, which decreases the threshold voltage of transistor 325. When phase detector 115 de-asserts down signal DN, the decreased threshold voltage decreases the resistance through transistor 325, and consequently decreases voltage Vmc. S/H circuit 335 then conveys the reduced memory cell voltage Vmc to oscillator 130 as the new control voltage Vctrl.

The degree to which the threshold voltage changes responsive to an up or down signal can be changed by adjusting the programming voltages Vppg and Vpps or the duration of the programming cycles. In one embodiment the durations of the up and down signals UP and DN are proportional to the phase error between the reference and feedback signals. As a result, larger phase errors provide more programming time and consequently greater control-voltage adjustments. Such embodiments can support continuous or fine-grained ranges of control voltages. Floating-gate transistors of various types can be formed using various processes, including standard CMOS processes.

In some embodiments phase detector 115 may assert narrow and equal UP and DN pulses when the RClk and FClk phases are matched. The subsequent two AND gates will deassert UP and DN when they are both asserted so that only one of Sup and Sdn will be asserted at any time.

Figure 4:
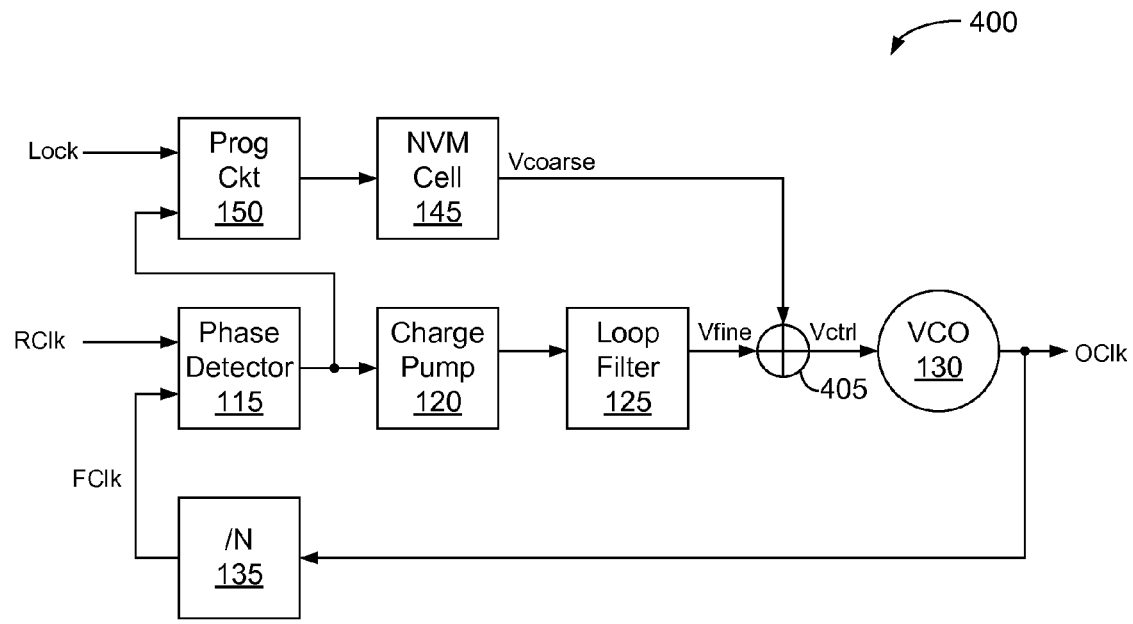
FIG. 4 is a clock-generator circuit 400 in accordance with a dual-loop embodiment.

FIG. 4 is a clock-generator circuit 400 in accordance with a dual-loop embodiment. Circuit 400 is a PLL that includes many components in common with prior embodiments. Components similar to prior examples are given like numbers and a detailed discussion is omitted for brevity.

Phase detector 115, charge pump 120, loop filter 125, clock source 130, and an optional clock divider 135 function much as a conventional PLL. Programming circuit 150 and memory cell 145 are included to develop a coarse control voltage Vcoarse. An adder 405 is also included to add course voltage Vcoarse to a fine adjustment voltage Vfine from loop filter 125. The analog voltage adder may be an operational amplifier summing two voltages or a wired-OR circuit that instead sums the proportional currents through a shared resistor. The resulting sum is control voltage Vctrl to clock source 130. The addition of voltage Vcoarse allow circuit 400 to operate at a higher loop bandwidth than e.g. circuit 300 of FIG. 3 using relatively small capacitors in loop filter 125.

Figure 5:
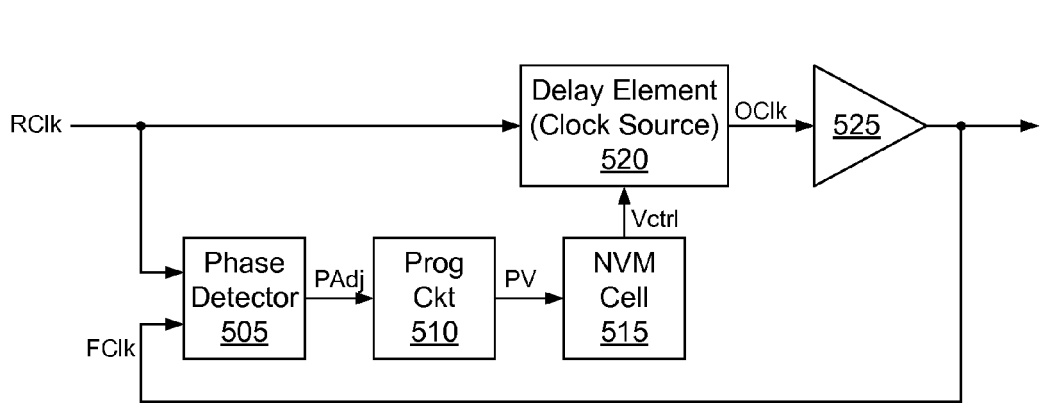
FIG. 5 depicts a clock-generator circuit 500 in accordance with a delay-locked loop embodiment.

FIG. 5 depicts a clock-generator circuit 500 in accordance with a delay-locked loop (DLL) embodiment. Circuit 500 includes a phase detector 505, a programming circuit 510, a NVM cell 515, a delay element 520, and an output buffer 525. Delay element 520 or the combination delay element 520 and buffer 525 may be considered the clock source in this embodiment. Phase detector 505 compares the phases of a reference clock signal RClk and a feedback clock signal FClk to produce a phase-adjust signal PAdj. As described above in connection with other embodiments, programming circuit 510 issues programming voltage signals PV to NVM cell 515 responsive to the phase-adjust signals. NVM cell 515 issues a control voltage Vctrl to control the delay through delay element 520, and thus to adjust the phase of a clock signal OClk. Buffer 525 conveys the resulting clock signal to phase detector 505, and conveys one or both of clock signals OClk and FClk to other clock destination circuits (not shown). The embodiments discussed above in connection with FIG. 1 can be implemented using DLLs by e.g. substituting the VCO with a voltage-controlled delay line (VCDL) and removing resistor R1. The embodiments of FIGS. 2-4 can similarly be implemented using DLLs.

Figure 6:
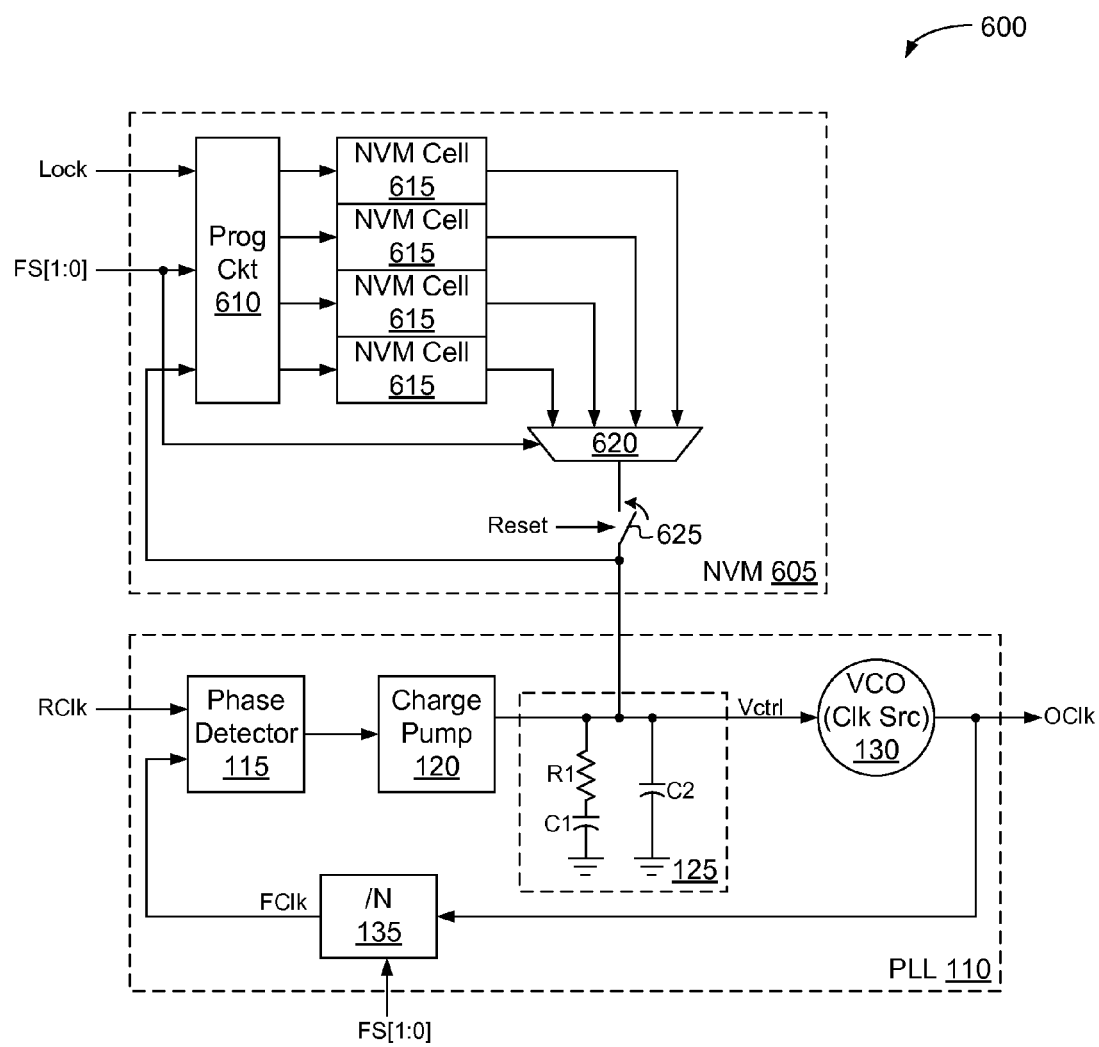
FIG. 6 depicts a clock-generator circuit 600 in accordance with a PLL embodiment that supports four lock frequencies.

FIG. 6 depicts a clock-generator circuit 600 in accordance with a PLL embodiment that supports four lock frequencies. Of the foregoing embodiments, clock-signal generator 600 is most like generator 100 of FIG. 1, with like-labeled elements being the same or similar. Generator 600 includes non-volatile memory 605 that includes a programming circuit 610, four NVM cells 615, an analog multiplexer 620, and a reset switch 625. A two-bit frequency-select signal FS[1:0] controls which NVM cell 615 is selected by programming circuit 610 and multiplexer 620, and further control the denominator N of clock divider 135. The frequency to which clock source 130 locks depends upon the value N. For each value of N, programming circuit 610 and the selected one of NVM cells 615 acts as discussed above in connection with FIG. 1 to store a control voltage Vctrl. The stored control voltages can thus be used to switch quickly between frequencies. Other embodiments can similarly be adapted to switch between output frequencies.

Figure 7:
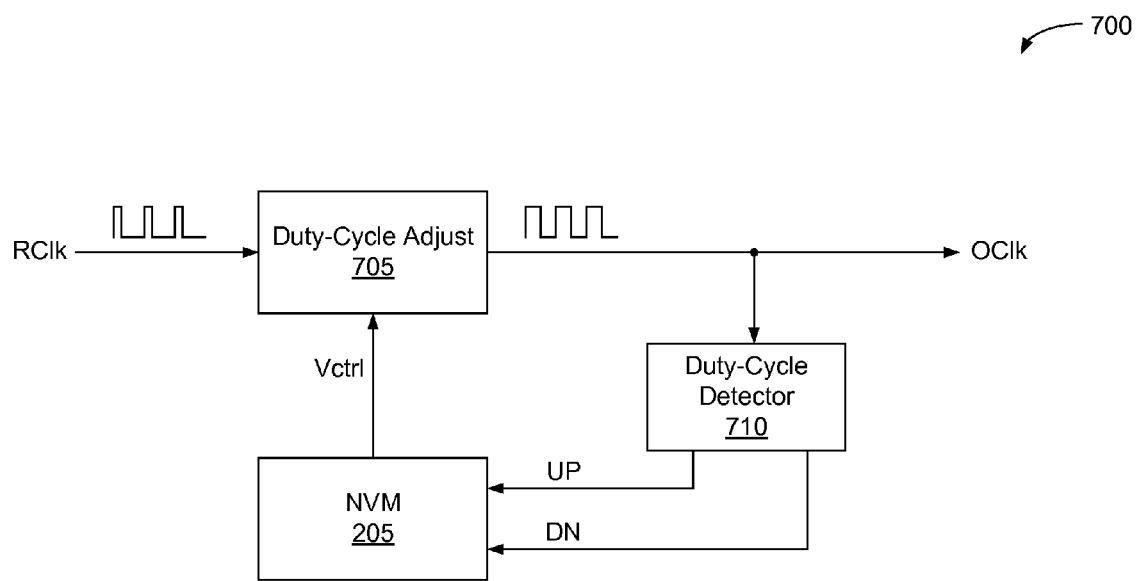
FIG. 7 depicts a duty-cycle correction circuit (DCC) 700 that uses non-volatile memory 205 like that discussed above in connection with FIG. 2 to store an analog control voltage Vctrl.

FIG. 7 depicts a duty-cycle correction circuit (DCC) 700 that uses non-volatile memory 205 like that discussed above in connection with FIG. 2 to store an analog control voltage Vctrl. DCC 700 includes a duty-cycle adjustment circuit 705 and a duty-cycle detector 710. Duty-cycle adjustment circuit 705 serves as a clock source for output clock signal OClk in this embodiment.

A reference clock signal RClk may include undesirable duty-cycle fluctuations. Adjustment circuit 705 derives an output clock signal OClk from reference clocks signal RClk, and is capable of adjusting the duty cycle of output clock signal OClk over a range responsive to changes in control voltage Vctrl. Duty-cycle detector 710 monitors output clock signal OClk, which in this embodiments serves as a feedback clock signal. Duty-cycle detector asserts an up signal UP if the duty cycle of signal OClk drops below a desired percentage (e.g., 50%) and asserts a down signal DN if the duty cycle rises above the desired percentage. NVM 205 responds to up and down signals in the manner discussed above in connection with FIG. 2 to alter Vctrl, and consequently bring the duty cycle of output clock signal OClk closer to the desired percentage. The reference and output clock signals may be of different frequencies in other embodiments.

In the foregoing description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments.

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in Caltech Intermediate Format (CIF), Calma GDS II Stream Format (GDSII), or Electronic Design Interchange Format (EDIF). Those of skill in the art of integrated circuit design can develop such data structures from schematic diagrams of the type detailed above and the corresponding descriptions and encode the data structures on computer readable medium. Those of skill in the art of integrated circuit fabrication can use such encoded data to fabricate integrated circuits comprising one or more of the circuits described herein.

While the present invention has been described in connection with specific embodiments, variations of these embodiments will be obvious to those of ordinary skill in the art. For example, other types of circuits may use feedback control loops that include NVM elements to reduce feedback bandwidth, start-up time, power die area, or leakage current.

Moreover, some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. Only those claims specifically reciting "means for" or "step for" should be construed in the manner required under the sixth paragraph of 35 U.S.C. §112.

What is claimed is:

1. A clock-signal generator, comprising:
    a non-volatile analog memory cell to output a stored analog control voltage; and
    a clock source to provide a clock signal, the clock source connected to receive the analog control voltage from the non-volatile analog memory cell, wherein the clock signal exhibits a phase, a duty cycle, and a frequency, and at least one of the phase, the duty cycle, and the frequency is controlled by the analog control voltage.

2. The signal generator of claim 1, wherein the clock source comprises a delay element.

3. The signal generator of claim 1, wherein the clock source comprises a voltage-controlled oscillator.

4. The signal generator of claim 3, in which:
    the clock source comprises a clock source control input at which the analog control voltage is received; and
    the signal generator additionally comprises a capacitor coupled between the clock source control input and a voltage reference.

5. The signal generator of claim 4, further comprising a charge pump coupled to the clock source control input.

6. The signal generator of claim 1, further comprising a sample-and-hold circuit interposed between the non-volatile analog memory cell and the clock source.

7. The signal generator of claim 1, further comprising program control circuitry coupled to the non-volatile analog memory cell, the program control circuitry to selectively apply a programming voltage to the non-volatile memory cell to alter the analog control voltage.

8. The signal generator of claim 7, further comprising a phase detector having at least one output coupled to the program-control circuitry.

9. The signal generator of claim 1, a source of a fine control voltage that additionally controls the at least one of the phase and the frequency.

10. The signal generator of claim 9, in which the source of the fine control voltage comprises a loop filter.

11. The signal generator of claim 10, further comprising a circuit to sum the fine control voltage and the analog control voltage to generate a sum, and to apply the sum to the clock source.

12. The signal generator of claim 1, in which:
    the signal generator additionally comprises a phase detector, a charge pump and a loop filter connected in series with one another and the clock source;
    the phase detector is connected to receive the clock signal from the clock source, and additionally to receive a reference signal; and
    the non-volatile analog memory cell stores a signal generated by the loop filter as the analog control voltage during operation of the signal generator, holds the analog control voltage upon deactivation of the signal generator, and restores the analog control voltage to the loop filter upon reactivation of the signal generator.

13. The signal generator of claim 1, in which:
    the signal generator additionally comprises a phase detector and a programming circuit;
    the phase detector, the programming circuit, the non-volatile analog memory cell and the clock source are connected in series; and
    the phase detector is connected to receive the clock signal from the clock source and additionally to receive a reference signal.

14. The signal generator of claim 1, in which the non-volatile analog memory cell comprises a floating-gate transistor.

15. An integrated circuit, comprising:
    a phase detector coupled to receive a first clock signal and a second clock signal, wherein the phase detector outputs phase adjustment signals in response to a phase difference between the first clock signal and the second clock signal;
    programming circuitry coupled to the phase detector to output programming signals responsive to the phase adjustment signals;
    a non-volatile analog memory cell coupled to receive the programming signals from the programming circuitry, wherein the non-volatile memory cell outputs a stored analog control voltage that varies over a range of control voltages in response to the programming signals; and
    a clock source from which the second clock signal is derived, the clock source connected to receive the analog control voltage from the non-volatile analog memory cell, wherein the second clock signal exhibits a phase, a duty cycle, and a frequency, and at least one of the phase, the duty cycle, and the frequency is controlled by the analog control voltage.

16. The integrated circuit of claim 15, wherein the clock source comprises one of a voltage controlled oscillator; a delay element; and a voltage controlled oscillator and a delay element.

17. The integrated circuit of claim 15, wherein
    the non-volatile analog memory cell comprises a memory cell output at which the analog control voltage is output; and
    the integrated circuit additionally comprises a capacitor coupled between the memory cell output and a voltage reference.

18. The integrated circuit of claim 17, further comprising a sample-and-hold circuit interposed between the memory cell output and the capacitor.

19. The integrated circuit of claim 15, further comprising an adder having inputs connected to receive the analog control voltage and a fine control voltage, respectively, and an output connected to provide a sum of the analog control voltage and the fine control voltage to control the clock source.

20. A method of controlling at least one of phase, frequency, and duty cycle of a clock signal, the method comprising:
    comparing a reference clock signal with a feedback clock signal to generate a clock-adjustment signal; and
    programming a non-volatile memory cell to store an analog control signal defined by the clock-adjustment signal, the non-volatile memory cell additionally outputting the analog control signal.

21. The method of claim 20, further comprising adjusting the at least one of the phase, the frequency, and the duty cycle of the clock signal responsive to the analog control signal.

22. The method of claim 21, further comprising periodically holding the analog control signal during the programming.

23. A computer-readable medium having stored thereon a data structure defining a clock generator circuit adapted to produce an output clock signal locked to a reference clock signal, the data structure comprising:
  first data representing a non-volatile analog memory cell to output a stored programmable analog control voltage; and
  second data representing a clock source to provide a clock signal, wherein the clock signal exhibits a clock phase, a duty cycle, and a clock frequency, and wherein the analog control signal controls at least one of the clock phase, the duty cycle, and the clock frequency responsive.

24. The medium of claim 23, wherein the second data defines the clock source as at least one of a delay-locked loop or a phase-locked loop.

25. A lock-loop circuit, comprising:
  a clock source generating a feedback clock signal having at least one of a feedback-clock phase, a feedback-clock duty cycle, or a feedback-clock frequency that changes in response to an analog control voltage;
  a clock-signal comparator to develop a clock-adjust signal from a reference clock signal and the feedback clock signal; and
  means for providing non-volatile analog storage of the analog control voltage, and for changing the stored analog control voltage in response to the clock-adjust signal.

* * * * *